United States Patent [19]

Plesko

[11] Patent Number: 4,488,116

[45] Date of Patent: Dec. 11, 1984

[54] INDUCTIVE COIN SENSOR FOR MEASURING MORE THAN ONE PARAMETER OF A MOVING COIN

[75] Inventor: George A. Plesko, Graterford, Pa.

[73] Assignee: Mars, Incorporated, McLean, Va.

[21] Appl. No.: 304,689

[22] Filed: Sep. 22, 1981

[51] Int. Cl.[3] ...................... G01N 27/72; G01R 33/12; G07F 3/02

[52] U.S. Cl. ............................... 324/236; 194/100 A; 331/65

[58] Field of Search ........................ 324/228, 234, 236; 336/30, 178; 194/100 A, 100 R, 101, 102; 331/65

[56] References Cited

U.S. PATENT DOCUMENTS 3,481,443 12/1969 Meloni ............................ 194/100 R 4,161,690 7/1979 Feier .................................. 324/71.3

FOREIGN PATENT DOCUMENTS 1947238 4/1971 Fed. Rep. of Germany .

2001962 10/1969 France .

765071 1/1957 United Kingdom .

1576714 10/1980 United Kingdom .

*Primary Examiner*—Gerard R. Strecker

*Assistant Examiner*—Walter E. Snow

*Attorney, Agent, or Firm*—Davis, Hoxie, Faithfull & Hapgood

[57] ABSTRACT

An apparatus for use in identification of coins is disclosed in which a coin is passed through the electromagnetic field of an inductive coil wound on a ferrite core having two poles, at least one of which has a diameter less than the diameter of the smallest coin in the coin set to be identified. The poles are separated along the coin path by a distance approximately equal to the diameter of the largest coin in the coin set to be identified. The coin's effect on the electromagnetic field is measured when the coin is between poles and when it is adjacent each pole façe.

25 Claims, 5 Drawing Figures

INDUCTIVE COIN SENSOR FOR MEASURING MORE THAN ONE PARAMETER OF A MOVING COIN

FIELD OF INVENTION

This invention relates to coin selection and, more particularly, to apparatus for identifying and authenticating coins by inductively testing their properties.

BACKGROUND OF THE INVENTION

Inductive coin testing apparatus utilize air core or ferrite core coils as sensing devices to measure the various electrical and physical parameters of coins. A coin is tested by detecting the effect of the coin on an alternating electromagnetic field produced by the coil. At a given frequency, this effect depends upon the coin's diameter, thickness, conductivity and permeability. An effect on this field causes a corresponding effect upon the coil's impedance which may be measured using various techniques.

The extent to which an electromagnetic field penetrates a coin decreases with increasing frequency. Therefore, as frequency increases, the physical properties of material near the surface of a coin have a greater effect on the field (and the coil's impedance), and interior material and coil thickness have a lesser effect. This phenomenon is especially significant when testing for laminated coins such as the United States ten and twenty-five cent coins.

Most high quality coin identificaton mechanisms, capable of excellent slug and foreign coin rejection, use multiple sensors in order to effectively measure physical characteristic, such as thickness and diameter, and material properties, such as conductivity and permeability. These mechanisms generally undertake several measurements which may require as many as five separate ferrite core coils. According to the method of one mechanism, first a mixed measurement is made that is dependent upon thickness, diameter and material. However, in order to separate these variables and establish coin identity, two additional measurements are made, one specific to thickness and a second specific to material.

Where a single sensor has been used, it generally has performed only a single test function.

SUMMARY OF THE INVENTION

The present invention employs an inductive sensor capable of measuring more than one parameter of a passing coin, thereby reducing or eliminating the need for additional sensors to accomplish the task of coin validation. The ferrite core of the sensor consists of two poles, with faces adjacent to the coin path, joined by a connecting member. The face of at least one pole of the ferrite core has a surface area less than, and capable of being totally circumscribed by, the surface area of the smallest coin of the coin set to be identified. This geometry causes a substantial portion of the magnentic flux emanating from this pole face to enter the face of all directly adjacent coins in the set to be identified, regardless of coin diameter. Since the electromagnetic field surrounding the sensor is concentrated in the areas adjacent to the pole faces, a coin's effect upon the field in these areas dominates field effects caused by the coin elsewhere in the vicinity surrounding the sensor. Thus, when a coin in the set to be identified is directly adjacent the pole face with surface area as described, the coin's overall effect upon the field, and the corresponding impedance change, is substantially independent of diameter. If the frequency of the field is sufficiently high (approximately 420 kHz), the coin parameters dominating a measurement at this point will be the physical properties of the material at the coin's surface.

The second pole of the sensor is separated from the first pole by a distance approximately equal to the diameter of the largest coin to be identified. When a coin in the set to be identified is between poles, this geometry causes the extent of interaction between the coin and the electromagnetic field surrounding pole faces to be substantially dependent on the diameter of the coin. Thus, the coin's overall interactional effect on the field, and the corresponding impedance change, when the coin is between poles, is substantially dependent on diameter.

If the second pole of the sensor is identical to the first pole, the interactional effect detected when a coin passes this pole will be identical to that measured when the coin is adjacent the first pole. However, by causing a substantial decrease in oscillator frequency (for example, to approximately 7 KHz) as the coin enters the area adjacent the second pole, the interactional effect will be a function primarily of coin thickness and conductivity of the material forming the inner layer of the coin. Again, the effect will be substantially independent of diameter.

By measuring the field interactional effect at two or more points while a coin passes the coin sensor of the present invention, the need for additional sensors for coin validation is decreased or eliminated.

In another embodiment, the coin sensor employs two substantially identical ferrite cores, each having a geometry as described above and each having a coil wound around its pole connecting member. The second core is placed on the opposite side of the coin path from the first core with pole faces directly adjacent corresponding pole faces of the first core. The coils are connected in either series aiding or series opposing configuration, and electromagnetic field interactional measurements are made as the coin passes through the sensor.

DESCRIPTION OF THE DRAWINGS

The present invention will be understood more readily when considered together with the accompanying drawings, in which.

The figures are intended to be representational and are not necessarily drawn to scale.

Throughout this specification, the term "coin" is intended to mean genuine coins, tokens, counterfeit coins, slugs, washers, and any other item which may be used by persons in an attempt to use coin-operated devices.

It will be clear to those skilled in the art that, whereas the invention has been described in terms of AND and OR logic elements, alternative logical elements may be used without departing from the invention.

DETAILED DESCRIPTION OF EMBODIMENTS

Although coin selection apparatus constructed in accordance with the principles of this invention may be designed to identify and accept any number of coins from the coin sets of many countries, this invention will be adequately illustrated by explanation of its application to identifying the U.S. five, ten and twenty-five cent coins.

Figure 1:
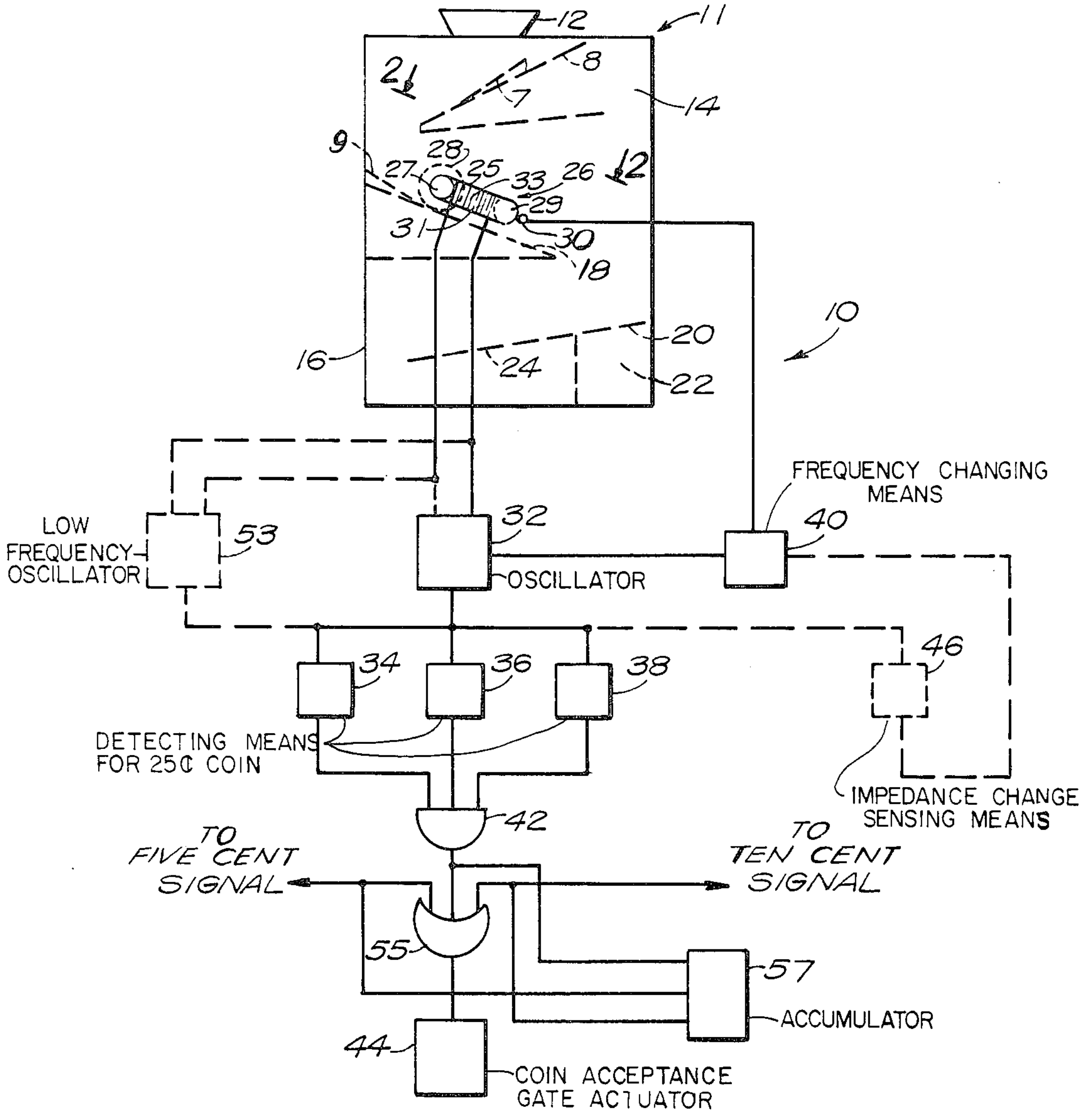
FIG. 1 is a front view of a coin handling mechanism along with a schematic block diagram of an apparatus for coin discrimination.

A coin selector 10 formed in accordance with the present invention is shown in FIG. 1. The mechanical arrangement of principal components is indicated by numeral 11. A coin 28 may be introduced into the coin selector 10 through the coin entry 12. The coin 28 falls under the influence of gravity onto energy dissipating device 7 which is mounted over coin deflector 8. Energy dissipating device 7 and coin deflector 8 are sloped downwards in a direction away from coin entry 12. The coin drops from coin deflector 8 onto energy dissipating device 9 and then onto coin track 18 where it moves along its edge under the influence of gravity past coin sensor 26. Energy dissipating devices 7 and 9 may be of the type disclosed in U.S. Pat. No. 3,944,038. Adjacent and contiguous to deflector 8 and coin track 18 are parallel front and back plates 14 and 16, spaced apart by a distance slightly greater than the thickness of the thickest coin to be identified by coin selector 10. Coin track 18 and deflector 8 are arranged at right angles to front and back plates 14 and 16.

At the end of coin track 18, the coin drops toward a coin acceptance gate 20. If the coin has been identified as acceptable, the coin acceptance gate 20 is retracted into back plate 16 by a solenoid (not shown) and the coin falls from the track 18 into a coin acceptance chute 22 leading to a coin box. If the coin is not recognized as acceptable, the coin acceptance gate 20 is not retracted and the coin falling from the end of the coin track 18 strikes the acceptance gate 20 and is diverted onto reject track 24 which leads to a coin return window (not shown).

Figure 2:
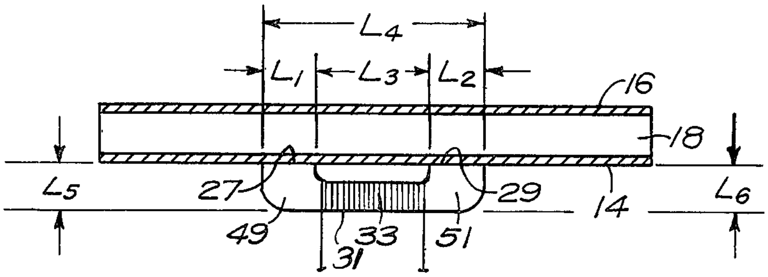
FIG. 2 is a sectional view taken along line 2—2 in FIG. 1 showing a side view of the coin sensor and a portion of the coin track.
Figure 3:
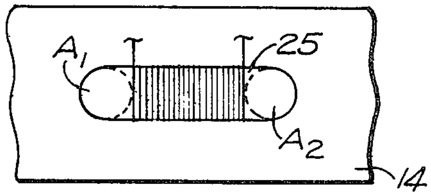
FIG. 3 is a bottom view of the sensor and front plate shown in FIG. 2.

Coin sensor 26 is shown in FIGS. 1, 2, and 3. It is mounted on front plate 14 adjacent to and slightly above coin track 18. The core 25 of sensor 26 is shaped like a tall, narrow letter "C" or a telephone handset. In this embodiment, core 25 has two cylindrical poles 49 and 51 forming circular, flat pole faces 27 and 29 which are located such that they are parallel to the faces of passing coins. Poles 49 and 51 are connected perpendicularly to pole connecting member 31, the major axis of which extends in the direction of coin path 18 and lies in a plane parallel to pole faces 27 and 29.

Pole face 27 has surface area $A_1$ and diameter $L_1$. Pole face 29 has surface area $A_2$ and diameter $L_2$. Poles 49 and 51 have lengths $L_5$ and $L_6$, respectively. The overall length of core 25 is $L_4$, and the distance between pole faces is $L_3$. In this embodiment, core 25 is symmetrical about a centerline passing perpendicularly through the midpoint of connecting member 31. Thus, $L_1=L_2$, $A_1=A_2$ and $L_5=L_6$.

The distance $L_3$ between pole faces is approximately equal to the diameter of the largest coin in the coin set to be identified, in this example, the U.S. twenty-five cent coin. The diameters $L_1$ and $L_2$ of pole faces 27 and 29 are less than the diameter of the smallest coin in the coin set to be identified, in this example, the U.S. ten cent coin. Thus, both $L_1$ and $L_2$, the diameters of the pole faces, are less than $L_3$, the distance between pole faces. Also, in this embodiment, both $L_5$ and $L_6$, the lengths of the poles, are less than $L_3$. Of course, it is unnecessary, according to the principles of this invention, that core 25 have cylindrical poles and circular pole faces. The poles of core 25 could have some other geometric shape (such as rectangular prisms with square pole faces) in which case, according to the relationship between core dimensions and coin dimensions described for core 25, the distance between pole faces would be greater than the greatest linear dimension of the pole faces.

Coin sensor 26 is mounted adjacent to coin track 18 such that if pole faces 27 and 29 were viewed in a direction perpendicular to plates 14 and 16, each pole face would be totally circumscribed by the smallest coin in the coin set to be identified when this coin is directly adjacent the pole face.

Coil 33 is wound on connecting member 31. The coil is part of the resonant circuit of electronic oscillator 32. As coin 28 moves along coin track 18 into the area adjacent pole face 27, the electromagnetic field emanating from this pole face is affected, causing a corresponding change in the impedance of coil 33. This impedance change produces changes in the frequency, phase and amplitude of both the current and voltage across coil 33 and the other circuit elements of oscillator 32. These changes are detected by detecting means which may be narrow-band frequency detector circuits or balanced-bridge circuits such as those disclosed in U.S. Pat. No. 3,870,137. Also, amplitude or phase-shift detecting means such as those disclosed in U.S. Pat. Nos. 3,952,851 and 3,966,034, respectively, may be used to sense this impedance change.

Detecting means 34, 36 and 38 examine oscillator 32 for the impedance change produced by one of the coins in the coin set to be identified. In this example, these detecting means are adjusted to detect the presence of a twenty-five cent coin passing sensor 26. Additional detecting means (not shown) are used to detect the presence of the five and ten cent coins.

Detecting means 34 is adjusted to produce a positive output signal when a twenty-five cent coin is directly adjacent pole face 27 such that the perimeter of the coin totally circumscribes this pole face. When in this position, the coin's effect upon the field surrounding coin sensor 26 is due primarily to its effect on that portion of the field immediately adjacent to pole face 27, and this effect is independent of the coin's diameter. When a coin is adjacent pole face 27, oscillator 32 operates at a high frequency (approximately 420 KHz for the five, ten and twenty-five cent coin set). Therefore, the effect upon the field sensed by detecting means 34 is primarily a function of the parameters of the material forming the surface layer of the twenty-five cent coin.

Detecting means 36 is adjusted to produce a positive output signal when a twenty-five cent coin is between pole faces 27 and 29 at a point approximately equidistant from each end of core 25. Since the distance between pole faces 27 and 29 is approximately equal to the diameter of the twenty-five cent coin, substantially no portion of the faces of coins in the coin set to be identified is adjacent either pole face when these coins are directly between the pole faces. A coin's overall effect upon the electromagnetic field when directly between pole faces is a function primarily of the extent to which the field surrounding the pole faces are intersected by the coin, and the extent of this intersection is substantially dependent on the coin's diameter. Therefore, the effect upon the field measured by detecting means 36 is substantially dependent on a coin's diameter.

Detecting means 38 is adjusted to produce a positive output signal when a twenty-five cent coin is directly adjacent to pole face 29. Thus, because of the symmetrical design of sensor 26, if the frequency of oscillator 32 were to remain constant, the effect upon the field sensed by detecting means 38 would be identical to that sensed by detecting means 34. However, coin presence sensor 30, which may be a photo-electric device, is located on front plate 14 downstream from sensor 26 and contiguous to pole 51 such that the emergence of a coin along coin track 18 from behind pole face 29 is immediately detected. The signal from sensor 30 goes to frequency changing means 40 which causes an immediate decrease in idling frequency of oscillator 32 (to approximately 7 KHz for the five, ten and twenty-five cent coin set). At a low frequency, when a coin circumscribes pole face 29, the effect upon the field measured by detecting means 38 is primarily a function of the properties of the material forming the inner layer of the coin and coin thickness.

The U.S. five, ten and twenty-five cent coin set along with most of the world's genuine coins are made of conductive, non-ferromagnetic material. Therefore, a genuine coin's interaction with the electromagnetic field surrounding coin sensor 26 will cause the effective inductance of coil 33 to decrease and the real part of the impedance of the coil to increase. Corresponding changes occur in frequency, phase and amplitude of current and voltage across coil 33 and the other elements of oscillator 32. As a coin approaches pole face 27 of coin sensor 26, these changes increase, reach a peak when the coin is directly opposite pole face 27, decrease when the coin is between pole faces, and then begin to increase again towards maximum as the coin approaches the area adjacent pole face 29. Therefore, as an alternative to employing coin presence sensor 30, impedance change sensing means 46 may be used to detect the nadir of this impedance-change cycle occurring when a coin is between pole faces and to activate frequency changing means 40.

As an alternative to employing frequency changing means 40, oscillator 53 idling at a resonant frequency substantially lower than oscillator 32, can be connected to coil 33 in parallel with oscillator 32. Detecting means 34, 36 and 38 are connected to both oscillators 32 and 53. In this embodiment, detecting means 34 would include a filter (not shown) to block out the low frequency component of the signal entering this detecting means. Similarly, detecting means 38 would include a filter (not shown) to block the high frequency component of the signal examined by this detecting means.

The outputs from detecting means 34, 36 and 38 are applied to the input terminals of AND gate 42. If each detecting means produces a positive output signal, AND gate 42 produces a positive output signal, indicating the presence of a twenty-five cent coin. This output signal is applied to coin acceptance gate actuator 44 through logical OR gate 55 and also is applied to accumulator 57 where the acceptance of a twenty-five coin is recorded.

Detecting means (not shown) also are employed to detect the five and ten cent coins. Measurements of the electromagnetic field interactional effect are made at the same three coin positions for which measurements are made in testing for the twenty-five cent coin. For each of the five and ten cent coins, a separate set of detecting means, similar to detecting means set 34, 36 and 38 used to detect the presence of a twenty-five cent coin, is connected to oscillator 32. The output of each detecting means of a set is applied to an AND gate (not shown) which produces a positive output signal, indicating the presence of a valid coin, when each detecting means of the set for that coin produces a positive output signal. The outputs of these AND gates also are applied to accumulator 57 and to coin acceptance gate actuator 44 through logical OR gate 55.

Typical values for core 25 for identifying the U.S. five, ten and twenty-five cent coin set are: $L_1 = L_2 = 1.3$ cm.; $L_3 = 2.4$ cm.; $L_4 = 5$ cm. For this coin set, a typical value for coil 33 is forty-eight turns of no. 32 wire.

Figure 4:
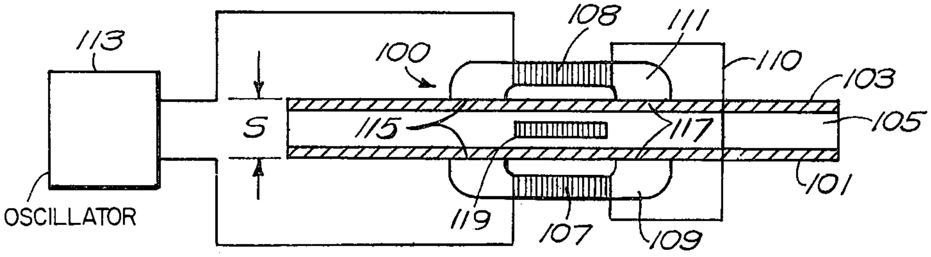
FIG. 4 is a sectional view illustrating a second embodiment of the invention.

A second embodiment of this invention is illustrated in FIG. 4. Except for coin sensor 100, the mechanical arrangement of principal components is identical to that illustrated in FIG. 1. Parallel front and back plates 101 and 103 form the sidewalls for coin track 105 on which coin 119 moves on its edge under the force of gravity. Coin sensor 100 comprises a pair of substantially identical ferrite cores, each of which has the same shape and geometry with respect to the coin set to be identified as that described for coin sensor 26. Core 109 is located on front plate 101 similarly to core 25. Core 111 is located on back plate 103 directly opposite core 109 such that the pole faces of each core are aligned to form two opposing pole sets 115 and 117. Opposing pole faces of each pole set are separated by distance S. Coil 107 is wound on the pole connecting member of core 109, and coil 108 is wound on the pole connecting member of core 111. Coils 107 and 108 are connected by lead 110 in a series aiding configuration and are both part of oscillator circuit 113. In the series aiding configuration, the combined inductance of coils 107 and 108 is maximized, and the opposite pole faces of each pole set are always of opposite polarity.

The effect upon the electromagnetic field surrounding coin sensor 100 caused by a coin passing through the sensor is measured by apparatus (not shown) similar to that illustrated in FIG. 1. Thus, three measurements, analogous to those undertaken by coin selector 10, are made as a coin passes through coin sensor 100. The first measurement is made when the coin is between and directly adjacent the faces of opposing pole set 115 such that the perimeter of the coin totally circumscribes both faces of this pole set. A second measurement is made when the coin is between pole sets 115 and 117 at a point approximately equidistant from each end of sensor 100. The third measurement is made when the coin is between and directly adjacent the faces of opposing pole set 117 such that the perimeter of the coin totally circumscribes both faces of this pole set. A frequency shift may be effected prior to this third measurement. As with coin selector 10, the first and third measurements are substantially independent of coin diameter, and the second measurement is substantially dependent on coin diameter. Depending on the frequency of oscillator 113, the first and third measurements will be functions primarily of surface material properties or of interior material properties and coin thickness.

The dual-core, symmetrical configuration of sensor 100 causes the concentrated electromagnetic field between the opposing faces of pole sets 115 and 117 to be substantially uniform along the axis extending perpendicularly from these faces. As a result, the effect upon the electromagnetic field surrounding the sensor caused by a coin's passage is substantially independent of the coin's position with respect to this axis.

Coils 107 and 108 also may be connected in a series opposing configuration. The sensitivity of sensor 100 in this configuration is paricularly high to coin thickness and surface irregularities.

Typical values for coin sensor 100 for identifying the U.S. five, ten and twenty-five cent coin set are: $L_1=L_2=1.3$ cm.; $L_3=2.4$ cm.; $L_4=5$ cm; $S=0.5$ cm. Coils 107 and 108 each consist of forty-eight turns of no. 32 wire. The ferrite core was selected and the coils wound so as to produce a maximum Q at a frequency of approximately 400 KHz. $Q=WL/R$, where W equals $2\pi$ times the frequency, L equals the inductance of the coils, and R equals the resistance of the coils.

Figure 5:
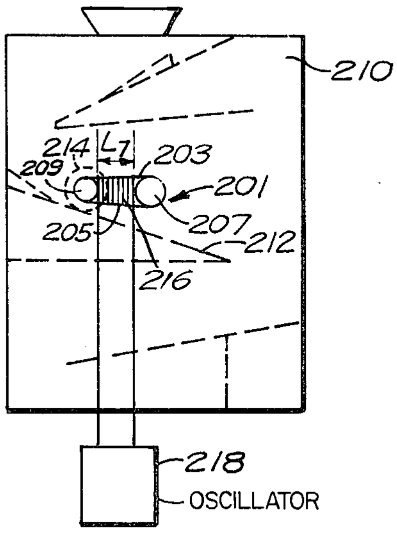
FIG. 5 shows a third embodiment of the invention.

A third embodiment of this invention is illustrated in FIG. 5. Except for coin sensor 201, the mechanical arrangement of principal components is identical to that illustrated in FIG. 1. The core 203 of sensor 201 is asymmetrical with pole faces 207 and 209 having different surface areas. Core 203 is located on front plate 210 such that pole connecting member 205 is not parallel to coin track 212. The distance $L_7$ between pole faces is approximately equal to the diameter of the largest coin in the coin set to be identified, and pole face 209 is totally circumscribed by the smallest coin in the coin set to be identified when this coin is directly adjacent this pole face. Thus, the diameter of pole face 209 is less than $L_7$, the distance between pole faces.

Coil 216 is wound on connecting member 205 and is part of the resonant circuit of electronic oscillator 218. The effect upon the electromagnetic field surrounding coin sensor 201 caused by a coin 214 passing the sensor is measured by apparatus (not shown) similar to that illustrated in FIG. 1. However, because of the asymmetrical design and position of core 203, frequency changing means are not employed because the field interactional effect detected when a coin passes pole face 209 is not identical to that measured when the coin passes pole face 207.

It would be clear to one skilled in the art that a microprocessor could be used in place of the elements of logic circuitry described in the various embodiments of this invention.

I claim:

1. An apparatus for identifying coins with respect to authenticity and denomination comprising:

an oscillator circuit comprising an inductor arranged to subject a coin to an electromagnetic field, the inductor comprising an elongated ferrite core and a coil, the core having first and second poles forming first and second pole faces, the first and second pole faces separated from each other by a distance greater than the greatest linear dimension of at least one pole face, the first and second poles connected by a pole connecting member around which is wound the coil, and the pole connecting member having a major axis lying in a plane substantially parallel to the faces of the core, means for causing relative motion of the coin through the electromagnetic field along a predetermined coin path adjacent the pole faces, means for producing a signal indicative of the degree of interaction of the coin with the electromagnetic field when the coin is adjacent a pole face, means for producing a signal indicative of the degree of interaction of the coin with the electromagnetic field when the coin is between poles, and means for producing a signal indicative of acceptability of the coin only if both interactional indications are within predetermined tolerances of an acceptable coin.

2. The apparatus of claim 1 wherein the first and second pole faces are separated from each other by a distance greater than the greatest linear dimension of both pole faces.

3. The apparatus of claim 1 wherein the first and second poles each have a length less than the distance between pole faces.

4. An apparatus for identifying coins with respect to authenticity and denomination comprising:

an oscillator circuit comprising an inductor arranged to subject a coin to an electromagnetic field, the inductor comprising a ferrite core and a coil, the core having first and second poles forming first and second pole faces, the first and second pole faces separated from each other by a distance approximately equal to the diameter of the largest coin to be identified, and the first and second poles connected by a pole connecting member around which is wound the coil, means for causing relative motion of the coin through the electromagnetic field along a predetermined coin path adjacent the pole faces, means for producing a signal indicative of the degree of interaction of the coin with the electromagnetic field when the coin is adjacent a pole face, means for producing a signal indicative of the degree of interaction of the coin with the electromagnetic field when the coin is between poles, and means for producing a signal indicative of acceptability of the coin only if both interactional indications are within predetermined tolerances of an acceptable coin.

5. The apparatus of claim 4 wherein the first pole face is totally circumscribed by the perimeter of the face of the smallest coin to be identified when this coin is directly adjacent to this pole face.

6. The apparatus of claim 4 wherein the first and second pole faces are each totally circumscribed by the perimeter of the face of the smallest coin to be identified when this coin is directly adjacent to the pole face.

7. The apparatus of claim 1 or 4 wherein the oscillator circuit comprises a second inductor, the second inductor comprising a ferrite core and a coil, the core being substantially identical to the first ferrite core and located adjacent the coin path opposite the first core.

8. The apparatus of claim 7 wherein the distance between the adjacent faces of each core is approximately 0.5 cm.

9. The apparatus of claim 7 wherein the inductors are connected in a series aiding configuration.

10. the apparatus of claim 7 wherein the inductors are connected in a series opposing configuration.

11. The apparatus of claim 1 or 4 wherein the first and second pole faces of the ferrite core are circular.

12. The apparatus of claim 11 wherein the ferrite core is symmetrical about a centerline passing perpendicularly through the midpoint of the pole connecting member.

13. The apparatus of claim 12 wherein the diameter of the first and second pole faces equals approximately 1.3 cm. and the distance between poles equals approximately 2.4 cm.

14. The apparatus of claim 1 or 4 wherein the predetermined coin path is defined by a coin supporting track and wherein the ferrite core is located adjacent to and slightly above the track with the pole connecting member extending in the direction of the track and the pole faces parallel to the faces of passing coins.

15. The apparatus of claim 14 further comprising means to direct the entry of a coin onto the coin track, mechanical gate means for separating acceptable coins from unacceptable coins, means for actuating the gate means responsive to the acceptability signal, and accumulator means arranged to record the value of an accepted coin.

16. An apparatus for identifying coins with respect to authenticity and denomination comprising an oscillator circuit comprising an inductor arranged to subject a coin to an electromagnetic field, the inductor comprising an elongated ferrite core and a coil, the core having first and second poles forming first and second pole faces, the first and second pole faces separated from each other by a distance greater than the greatest linear dimension of at least one pole face, the first and second poles connected by a pole connecting member around which is wound the coil, and the pole connecting member having a major axis lying in a plane substantially parallel to the faces of the core, means for causing relative motion of the coin through the electromagnetic field along a predetermined coin path adjacent the pole faces, means for producing a signal indicative of the degree of interaction of the coin with the electromagnetic field when the coin is adjacent the first pole face, means for producing a signal indicative of the degree of interaction of the coin with the electromagnetic field when the coin is between poles, means for producing a signal indicative of the degree of interaction of the coin with the electromagnetic field when the coin is adjacent the second pole face, and means for producing a signal indicative of acceptability of the coin only if all three interactional indications are within predetermined tolerances of an acceptable coin.

17. An apparatus for identifying coins with respect to authenticity and denomination comprising:

an oscillator circuit comprising an inductor arranged to subject a coin to an electromagnetic field, the inductor comprising a ferrite core and a coil, the core having first and second poles forming first and second pole faces, the first and second pole faces separated from each other by a distance approximately equal to the diameter of the largest coin to be identified, and the first and second poles connected by a pole connecting member around which is wound the coil, means for causing relative motion of the coin through the electromagnetic field along a predetermined coin path adjacent the pole faces, means for producing a signal indicative of the degree of interaction of the coin with the electromagnetic field when the coin is adjacent the first pole face, means for producing a signal indicative of the degree of interaction of the coin with the electromagnetic field when the coin is between poles, means for producing a signal indicative of the degree of interaction of the coin with the electromagnetic field when the coin is adjacent the second pole face, and means for producing a signal indicative of acceptability of the coin only if all three interactional indications are within predetermined tolerances of an acceptable coin.

18. An apparatus for identifying coins with respect to authenticity and denomination comprising:

an oscillator circuit comprising an inductor arranged to subject a coin to an electromagnetic field, the inductor comprising an elongated ferrite core and a coil, the core having first and second poles forming first and second poles faces, the first and second poles faces separated from each other by a distance greater than the greatest linear dimension of at least one pole face, the first and second poles connected by a pole connecting member around which is wound the coil, and the pole connecting member having a major axis lying in a plane substantially parallel to the faces of the core, means for causing relative motion of the coin through the electromagnetic field along a predetermined coin path adjacent the pole faces, means for producing a signal indicative of the degree of interaction of the coin with the electromagnetic field when the coin is at a first position adjacent the core, means for producing a signal indicative of the degree of interaction of the coin with the electromagnetic field when the coin is at a second position adjacent the core, means for operating the oscillator circuit at two substantially different frequencies, a first frequency when the coin is at the first position adjacent the core and a second frequency when the coin is at the second position adjacent the core, and means for producing a signal indicative of acceptability of the coin only if both interactional indications are within predetermined tolerances of an acceptable coin.

19. An apparatus for identifying coins with respect to authenticity and denomination comprising:

an oscillator circuit comprising an inductor arranged to subject a coin to an electromagnetic field, the inductor comprising a ferrite core and a coil, the core having first and second poles forming first and second pole faces, the first and second pole faces separated from each other by a distance approximately equal to the diameter of the largest coin to be identified, and the first and second poles connected by a pole connecting member around which is wound the coil, means for causing relative motion of the coin through the electromagnetic field along a predetermined coin path adjacent the pole faces, means for producing a signal indicative of the degree of interaction of the coin with the electromagnetic field when the coin is at a first position adjacent the core, means for producing a signal indicative of the degree of interaction of the coin with the electromagnetic field when the coin is at a second position adjacent the core, means for operating the oscillator circuit at two substantially different frequencies, a first frequency when the coin is at the first position adjacent the core and a second frequency when the coin is at the second position adjacent the core, and means for producing a signal indicative of acceptability of the coin only if both interactional indications are within predetermined tolerances of an acceptable coin.

20. The apparatus of claim 18 or 19 wherein the first frequency is approximately 420 KHz and the second frequency is approximately 7 KHz.

21. The apparatus of claim 18 or 19 wherein the change in oscillator frequency is initiated by a signal generated by photo-electric means, responsive to coin position, approximately contiguous to the second pole.

22. The apparatus of claim 18 or 19 further comprising impedance-change sensing means for initiating the change in oscillator frequency.

23. An apparatus for identifying coins with respect to authenticity and denomination comprising:

a first oscillator circuit comprising an inductor arranged to subject a coin to an electromagnetic field, the inductor comprising an elongated ferrite core and a coil, the core having first and second poles forming first and second pole faces, the first and second pole faces separated from each other by a distance greater than the greatest linear dimension of at least one pole face, the first and second poles connected by a pole connecting member around which is wound the coil, and the pole connecting member having a major axis lying in a plane substantially parallel to the faces of the core, means for causing relative motion of the coin through the electromagnetic field along a predetermined coin path adjacent the pole faces, means for producing a signal indicative of the degree of interaction of the coin with the electromagnetic field when the coin is at a first position adjacent the core, means for producing a signal indicative of the degree of interaction of the coin with the electromagnetic field when the coin is at a second position adjacent the core, a second oscillator circuit connected to the inductor in parallel with the first oscillator circuit and operating at a frequency substantially different from the frequency of the first oscillator circuit, wherein the electromagnetic field has two frequency components, and the means for producing a signal indicative of the degree of interaction of the coin with the electromagnetic field when the coin is at the first position adjacent the core is responsive to the first frequency component, and the means for producing a signal indicative of the degree of interaction of the coin with the electromagnetic field when the coin is at the second position adjacent the core is responsive to the second frequency component, and means for producing a signal indicative of acceptability of the coin only if both interactional indications are within predetermined tolerances of an acceptable coin.

24. An apparatus for identifying coins with respect to authenticity and denomination comprising:

a first oscillator circuit comprising an inductor arranged to subject a coin to an electromagnetic field, the inductor comprising a ferrite core and a coil, the core having first and second poles forming first and second pole faces, the first and second pole faces separated from each other by a distance approximately equal to the diameter of the largest coin to be identified, and the first and second poles connected by a pole connecting member around which is wound the coil, means for causing relative motion of the coin through the electromagnetic field along a predetermined coin path adjacent the pole faces, means for producing a signal indicative of the degree of interaction of the coin with the electromagnetic field when the coin is at a first position adjacent the core, means for producing a signal indicative of the degree of interaction of the coin with the electromagnetic field when the coin is at a second position adjacent the core, a second oscillator circuit connected to the inductor in parallel with the first oscillator circuit and operating at a frequency substantially different from the frequency of the first oscillator circuit, wherein the electromagnetic field has two frequency components, and the means for producing a signal indicative of the degree of interaction of the coin with the electromagnetic field when the coin is at the first position adjacent the core is responsive to the first frequency component, and the means for producing a signal indicative of the degree of interaction of the coin with the electromagnetic field when the coin is at the second position adjacent the core is responsive to the second frequency component, and means for producing a signal indicative of acceptability of the coin only if both interactional indications are within predetermined tolerances of an acceptable coin.

25. The apparatus of claim 23 or 24 wherein the frequency of the first oscillator is approximately 420 KHz and the frequency of the second oscillator is approximately 7 KHz.

* * * * *

UNITED STATES PATENT AND TRADEMARK OFFICE
CERTIFICATE OF CORRECTION

PATENT NO. : 4,488,116

DATED : December 11, 1984

INVENTOR(S) : George A. Plesko

It is certified that error appears in the above—identified patent and that said Letters Patent is hereby corrected as shown below:

Col. 1, line 27, "coil" should be --coin--.

Col. 1, line 31, "identificaton" should be --identification--.

Col. 1, line 34, "characteristic" should be --characteristics--.

Col. 1, line 59, "magnentic" should be --magnetic--.

Col. 5, line 62, insert --cent-- after "twenty-five".

Col. 8, line 55 (claim 8) "the" should be --The--.

Col. 10, line 12 (claim 18) "poles" should be --pole--.

Signed and Sealed this

*Third* Day of *September 1985*

[SEAL]

*Attest:*

DONALD J. QUIGG

*Attesting Officer* *Acting Commissioner of Patents and Trademarks - Designate*